US012765177B2

(12) United States Patent
Zhao et al.

(10) Patent No.: US 12,765,177 B2
(45) Date of Patent: Oct. 13, 2026

(54) DISPLAY SUBSTRATE AND DISPLAY DEVICE

(71) Applicant: BOE TECHNOLOGY GROUP CO., LTD., Beijing (CN)

(72) Inventors: Dejiang Zhao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 553 days.

(21) Appl. No.: 17/639,499

(22) PCT Filed: Mar. 30, 2021

(86) PCT No.: PCT/CN2021/083813
§ 371 (c)(1),
(2) Date: Mar. 1, 2022

(87) PCT Pub. No.: WO2022/204910
PCT Pub. Date: Oct. 6, 2022

(65) Prior Publication Data

US 2022/0359627 A1 Nov. 10, 2022

(51) Int. Cl.
*H10K 59/122* (2023.01)

(52) U.S. Cl.
CPC .................................. *H10K 59/122* (2023.02)

(58) Field of Classification Search
CPC .................................................... H10K 59/122
See application file for complete search history.

(56) References Cited

U.S. PATENT DOCUMENTS

2008/0095981 A1 4/2008 Carter et al.
2013/0234126 A1 9/2013 Nakatani
(Continued)

FOREIGN PATENT DOCUMENTS

CN 1518140 A 8/2004
CN 102960068 A 3/2013
(Continued)

OTHER PUBLICATIONS

CN Office Action dated Dec. 31, 2025 corresponding to Application No. 202180000623.7, 20 pages with English translation.

*Primary Examiner* — Matthew L Reames
(74) *Attorney, Agent, or Firm* — MUNCY, GEISSLER, OLDS & LOWE, P.C.

(57) ABSTRACT

A display substrate is provided, including a base substrate, an anode layer arranged on the base substrate, a pixel definition layer arranged at a side of the anode layer away from the base substrate and configured to define a plurality of pixels, and a plurality of pixel banks arranged on the pixel definition layer. The pixel definition layer and the plurality of pixel banks are arranged in such a manner as to divide each pixel into a plurality of subpixels. The pixel banks include first pixel banks each arranged between two adjacent subpixels in different colors, each first pixel bank is a line bank extending in a first direction, a light-emitting region for covering an anode of an OLED element and a non-light-emitting region outside the light-emitting region are arranged between two adjacent first pixel banks in a same pixel along the first direction, and an organic light-emitting layer barrier structure is arranged at the non-light-emitting region to reduce a difference between a thickness of an organic light-emitting layer at a periphery of the subpixel and a thickness of the organic light-emitting layer in the middle of the subpixel in a direction perpendicular to the base substrate. A display device is further provided.

7 Claims, 7 Drawing Sheets

(56) References Cited

U.S. PATENT DOCUMENTS

| | | | |
|---|---|---|---|
| 2016/0079322 A1 | 3/2016 | Kim et al. | |
| 2019/0181196 A1 | 6/2019 | Dai | |
| 2019/0280060 A1 | 9/2019 | Liu et al. | |
| 2020/0194518 A1 | 6/2020 | Myung et al. | |
| 2020/0295299 A1 | 9/2020 | Yin et al. | |
| 2020/0303686 A1 | 9/2020 | Zhao et al. | |
| 2021/0175281 A1* | 6/2021 | Choi .................... | H10H 20/831 |

FOREIGN PATENT DOCUMENTS

| | | | |
|---|---|---|---|
| CN | 105118846 | A | 12/2015 |
| CN | 105789246 | A | 7/2016 |
| CN | 106783939 | A | 5/2017 |
| CN | 207441754 | U | 6/2018 |
| CN | 108321181 | A | 7/2018 |
| CN | 109445198 | A | 3/2019 |
| CN | 109461837 | A | 3/2019 |
| CN | 109683402 | A | 4/2019 |
| CN | 111326549 | A | 6/2020 |
| CN | 111341925 | A | 6/2020 |
| CN | 112002831 | A | 11/2020 |
| CN | 113130556 | A | 7/2021 |
| JP | 2010073602 | A | 4/2010 |

* cited by examiner

DISPLAY SUBSTRATE AND DISPLAY DEVICE

CROSS REFERENCE OF RELATED APPLICATION

This application is the U.S. national phase of PCT Application PCT/CN2021/083813 filed on Mar. 30, 2021, which is incorporated herein by reference in its entirety.

TECHNICAL FIELD

The present disclosure relates to the manufacture of a display product, in particular to a display substrate, a display panel and a display device.

BACKGROUND

Line bank is commonly used to print an Organic Light-Emitting Diode (OLED) structure. The use of the line bank to design a solution-type OLED element has many advantages, e.g., an increased aperture ratio of a pixel, and increased film-forming uniformity in the pixel. However, it also has various disadvantages, e.g., crosstalk easily occurs, and mura occurs at a peripheral position because ink is dried unevenly. Particularly, it is impossible to eliminate mura through process improvement and device adjustment.

SUMMARY

An object of the present disclosure is to provide a display substrate and a display device, to solve the problem that the ink is dried unevenly at a peripheral position.

In one aspect, the present disclosure provides in some embodiments a display substrate, including a base substrate, an anode layer arranged on the base substrate, a pixel definition layer arranged at a side of the anode layer away from the base substrate and configured to define a plurality of pixels, and a plurality of pixel banks arranged on the pixel definition layer. The pixel definition layer and the plurality of pixel banks are arranged in such a manner as to divide each pixel into a plurality of subpixels. The pixel banks include first pixel banks each arranged between two adjacent subpixels in different colors, each first pixel bank is a line bank extending in a first direction, a light-emitting region for covering an anode of an OLED element and a non-light-emitting region outside the light-emitting region are arranged between two adjacent first pixel banks in a same pixel along the first direction, and an organic light-emitting layer barrier structure is arranged at the non-light-emitting region to reduce a difference between a thickness of an organic light-emitting layer at a periphery of the subpixel and a thickness of the organic light-emitting layer in the middle of the subpixel in a direction perpendicular to the base substrate.

In an embodiment of the present disclosure, the light-emitting region is arranged between two non-light-emitting regions in one subpixel in the first direction, the organic light-emitting layer barrier structure is arranged at a side of the pixel definition layer away from the base substrate, and the organic light-emitting layer barrier structure is arranged at a same layer as the pixel banks.

In an embodiment of the present disclosure, two adjacent first pixel banks include a first pixel sub-bank and a second pixel sub-bank, and the organic light-emitting layer barrier structure includes at least one first organic light-emitting layer barrier sub-structure arranged at a side of the first pixel sub-bank close to the second pixel sub-bank, and/or at least one second organic light-emitting layer barrier sub-structure arranged at a side of the second pixel sub-bank close to the first pixel sub-bank.

In an embodiment of the present disclosure, each subpixel is provided with a plurality of first organic light-emitting layer barrier sub-structures spaced apart from each other in the first direction and a plurality of second organic light-emitting layer barrier sub-structures spaced apart from each other in the first direction.

In an embodiment of the present disclosure, an orthogonal projection of each first organic light-emitting layer barrier sub-structure onto the second pixel sub-bank is located between two adjacent second organic light-emitting layer barrier sub-structures.

In an embodiment of the present disclosure, the first organic light-emitting layer barrier sub-structure partially overlaps the second organic light-emitting layer barrier sub-structure in the first direction.

In an embodiment of the present disclosure, a gap between the first organic light-emitting layer barrier sub-structure and the second organic light-emitting layer barrier sub-structure is greater than or equal to 0 in a direction perpendicular to the first direction.

In an embodiment of the present disclosure, an orthogonal projection of the first organic light-emitting layer barrier sub-structure onto the second pixel sub-bank coincides with an orthogonal projection of the second organic light-emitting layer barrier sub-structure onto the second pixel sub-bank, and a gap between the first organic light-emitting layer barrier sub-structure and the second organic light-emitting layer barrier sub-structure is greater than 0.

In an embodiment of the present disclosure, a distance between the first organic light-emitting layer barrier sub-structure and the second organic light-emitting layer barrier sub-structure in a direction perpendicular to the first direction gradually decreases in a direction facing the light-emitting region.

In an embodiment of the present disclosure, a distance between adjacent first organic light-emitting layer barrier sub-structures is 10% to 70% of a length of the light-emitting region in the first direction, and a distance between adjacent second organic light-emitting layer barrier sub-structures is 10% to 70% of the length of the light-emitting region in the first direction.

In an embodiment of the present disclosure, a height of the first organic light-emitting layer barrier sub-structure in a direction perpendicular to the base substrate is substantially identical to a height of the first pixel sub-bank in the direction perpendicular to the base substrate, and a height of the second organic light-emitting layer barrier sub-structure in the direction perpendicular to the base substrate is substantially identical to a height of the second pixel sub-bank in the direction perpendicular to the base substrate.

In an embodiment of the present disclosure, a height of the first organic light-emitting layer barrier sub-structure in a direction perpendicular to the base substrate is 1.2 μm to 2 μm, and a height of the second organic light-emitting layer barrier sub-structure in the direction perpendicular to the base substrate is 1.2 μm to 2 μm.

In an embodiment of the present disclosure, the pixel banks further include second pixel banks extending in a second direction perpendicular to the first direction, and two first pixel banks opposite to each other and two second pixel banks opposite to each other are configured to define one subpixel. Two adjacent first pixel banks include a first pixel sub-bank and a second pixel sub-bank, and in the non-light-emitting region, the organic light-emitting layer barrier structure includes at least one first drainage post arranged at a side of the first pixel sub-bank close to the second pixel sub-bank, and/or at least one second drainage post arranged at a side of the second pixel sub-bank close to the first pixel sub-bank.

In an embodiment of the present disclosure, the organic light-emitting layer barrier structure includes at least one first drainage post arranged at a side of the first pixel sub-bank close to the second pixel sub-bank, at least one second drainage post arranged at a side of the second pixel sub-bank close to the first pixel sub-bank, and at least one third drainage post arranged at a side of the second pixel bank close to the non-light-emitting region.

In an embodiment of the present disclosure, a plurality of first drainage posts is spaced apart from each other in the first direction at a side of the first pixel sub-bank close to the second pixel sub-bank, a plurality of second drainage posts is spaced apart from each other in the first direction at a side of the second pixel sub-bank close to the first pixel sub-bank, and a plurality of third drainage posts is spaced apart from each other in the second direction at a side of the second pixel bank close to the non-light-emitting region.

In an embodiment of the present disclosure, the first drainage post, the second drainage post and the third drainage post are lyophilic, heights of the first drainage post, the second drainage post and the third drainage post in a direction perpendicular to the base substrate are the same, and the height of the first drainage post in the direction perpendicular to the base substrate is 70% to 90% of a height of the first pixel sub-bank.

In an embodiment of the present disclosure, the height of the first drainage post is 3 μm to 8 μm.

In an embodiment of the present disclosure, a gap between two adjacent first drainage posts is 10 μm to 15 μm, a gap between two adjacent second drainage posts is 10 μm to 15 μm, and a gap between two adjacent third drainage posts is 10 μm to 15 μm.

In an embodiment of the present disclosure, the organic light-emitting layer barrier structure includes a plurality of step-like grooves formed in the non-light-emitting region, and depths of the step-like grooves in the direction perpendicular to the base substrate gradually decrease in a direction facing the light-emitting region.

In an embodiment of the present disclosure, the plurality of step-like grooves have a maximum depth of 1 μm and a minimum depth of 0.1 μm.

In an embodiment of the present disclosure, a total length of the plurality of step-like grooves in the first direction is 1 to 1.5 times of a length of the light-emitting region.

In another aspect, the present disclosure provides in some embodiments a display panel including the above-mentioned display substrate.

In yet another aspect, the present disclosure provides in some embodiments a display device including the above-mentioned display panel.

The present disclosure has the following beneficial effects. Through the organic light-emitting layer barrier structure, it is able to reduce a difference between a dryness level of ink at a periphery of the pixel and a dryness level of the ink in the middle of the pixel, thereby to improve uniformity of a thin film formed after the ink has been dried.

DETAILED DESCRIPTION

Figure 1:
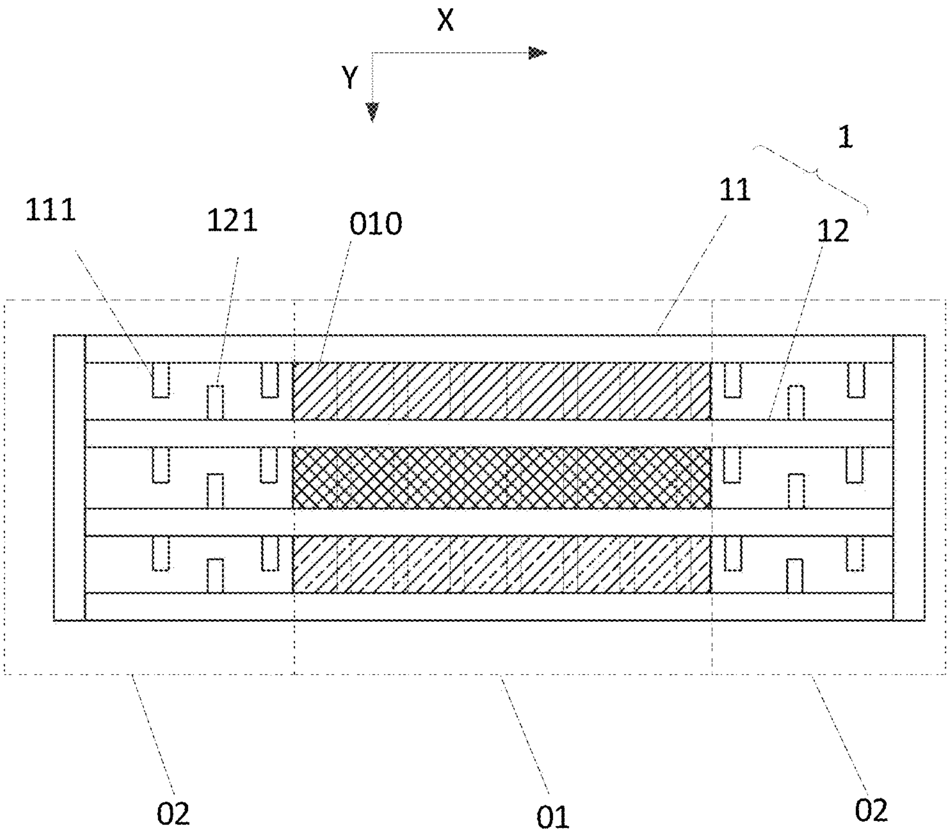
FIG. 1 is a schematic view showing a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

Currently, in a commonly-used process for preparing a printed electroluminescent element, ink is filled into a region defined by line banks through inkjet printing so that the ink spreads in the region surrounded by the line banks. Next, the ink is dried in a vacuum at a given temperature (e.g., a low temperature). Parameters of a solvent, e.g., a volatilization rate and a vapor pressure, are strictly controlled, to evenly dry the ink at different regions in a pixel and the ink between different pixels as possible. Finally, a resultant thin film is dried thoroughly through baking.

However, in the process of drying the ink, due to a coffee-ring effect, the ink at a periphery of the region defined by the line banks is dried more quickly than the ink in the middle of the region. In addition, due to a surface tension of the ink, the ink at the periphery shrinks toward the middle of the region, so a thickness of the dried ink at the periphery is smaller than a thickness of the dried ink in the middle.

In order to solve the above problems, as shown in FIGS. 1 to 13, the present disclosure provides in some embodiments a display substrate, which includes a base substrate, an anode layer AND1 arranged on the base substrate, a pixel definition layer PDL arranged at a side of the anode layer AND1 away from the base substrate and configured to define a plurality of pixels, and a plurality of pixel banks arranged on the pixel definition layer PDL. The pixel definition layer PDL and the plurality of pixel banks are arranged in such a manner as to divide each pixel into a plurality of subpixels. The pixel banks include first pixel banks 1 each arranged between two adjacent subpixels in different colors, each first pixel bank 1 is a line bank extending in a first direction (direction X in FIG. 1), a light-emitting region 01 for covering an anode of an OLED element and a non-light-emitting region 02 outside the light-emitting region 01 are arranged between two adjacent first pixel banks 1 in a same pixel along the first direction, and an organic light-emitting layer barrier structure is arranged at the non-light-emitting region 02 to reduce a difference between a thickness of an organic light-emitting layer EML at a periphery of the subpixel and a thickness of the organic light-emitting layer EML in the middle of the subpixel in a direction perpendicular to the base substrate.

Usually, the light-emitting region 01 is located at a central position while the non-light-emitting region 02 is located at a peripheral position. Through the organic light-emitting layer barrier structure, it is able to reduce a movement speed of the ink to the light-emitting region, and reduce the difference between the thickness of the organic light-emitting layer EML at the periphery of the subpixel and the thickness of the organic light-emitting layer EML in the middle of the subpixel in the direction perpendicular to the base substrate, thereby to improve the uniformity of the thin film.

Illustratively, the light-emitting region 01 is arranged between two non-light-emitting regions 02 in one subpixel in the first direction, the organic light-emitting layer barrier structure is arranged at a side of the pixel definition layer PDL away from the base substrate, and the organic light-emitting layer barrier structure is arranged at a same layer as the pixel banks.

As shown in FIG. 1, in the embodiments of the present disclosure, in one subpixel, the anode of the OLED element covered by the light-emitting region 01 is divided into a plurality of separate sub-anodes 010 in the first direction. In three-dimensional (3D) display, the sub-anodes 010 may be controlled and enabled separately, to increase resolution.

The organic light-emitting layer barrier structure may be of various structural forms, and several structural forms will be described hereinafter in details.

In a first structural form, as shown in FIGS. 1 to 4, illustratively two adjacent first pixel banks 1 include a first pixel sub-bank 11 and a second pixel sub-bank 12, and the organic light-emitting layer barrier structure includes at least one first organic light-emitting layer barrier sub-structure 111 arranged at a side of the first pixel sub-bank 11 close to the second pixel sub-bank 12, and/or at least one second organic light-emitting layer barrier sub-structure 121 arranged at a side of the second pixel sub-bank 12 close to the first pixel sub-bank 11.

In the embodiments of the present disclosure, the first organic light-emitting layer barrier sub-structure 111 has a same structure as the second organic light-emitting layer barrier structure 121.

Illustratively, a plurality of first organic light-emitting layer barrier sub-structures 111 is spaced apart from each other at a side of the first pixel sub-bank 11 close to the second pixel sub-bank 12, and a plurality of second organic light-emitting layer barrier sub-structures 121 is spaced apart from each other at a side of the second pixel sub-bank 12 close to the first pixel sub-bank 11. In other words, each subpixel is provided with the plurality of first organic light-emitting layer barrier sub-structures 111 spaced apart from each other in the first direction and the plurality of second organic light-emitting layer barrier sub-structures 121 spaced apart from each other in the first direction.

Figure 2:
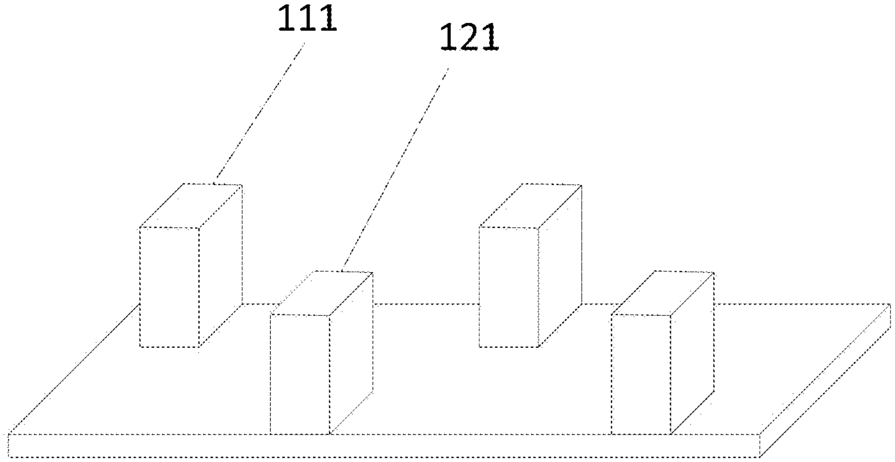
FIG. 2 is a schematic view showing an organic light-emitting layer barrier structure according to one embodiment of the present disclosure.
Figure 3:
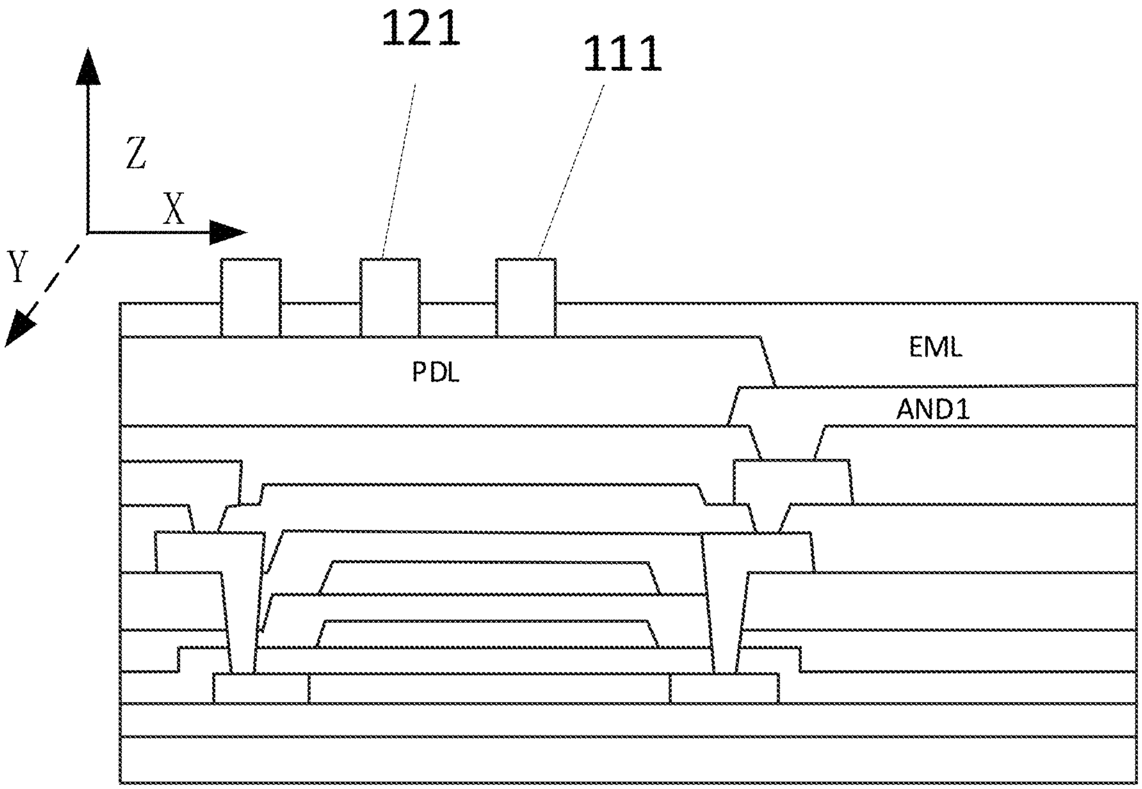
FIG. 3 is a partial sectional view of the display substrate in FIG. 1.

Illustratively, an orthogonal projection of each first organic light-emitting layer barrier sub-structure 111 onto the second pixel sub-bank 12 is located between two adjacent second organic light-emitting layer barrier sub-structures 121. FIG. 2 is a solid view of the first organic light-emitting layer barrier sub-structure 111 and the second organic light-emitting layer barrier sub-structure 121.

Illustratively, the first organic light-emitting layer barrier sub-structure 111 partially overlaps the second organic light-emitting layer barrier sub-structure 121 in the first direction.

Illustratively, a gap between the first organic light-emitting layer barrier sub-structure 111 and the second organic light-emitting layer barrier sub-structure 121 is greater than or equal to 0 in a second direction (i.e., direction Y in FIG. 1) perpendicular to the first direction. In other words, the first organic light-emitting layer barrier sub-structure 111 does not overlap the second organic light-emitting layer barrier structure 121 in the first direction.

A distance between the adjacent first organic light-emitting layer barrier sub-structures 111 is 10% to 70% of a length of the light-emitting region 01 in the first direction, and a distance between the adjacent second organic light-emitting layer barrier sub-structures 121 is 10% to 70% of the length of the light-emitting region 01 in the first direction.

In a specific embodiment of the present disclosure, the distance between the adjacent first organic light-emitting layer barrier sub-structures 111 is 30% to 50% of the length of the light-emitting region 01 in the first direction, and the distance between the adjacent second organic light-emitting layer barrier sub-structures 121 is 30% to 50% of the length of the light-emitting region 01 in the first direction.

The distance between the adjacent first organic light-emitting layer barrier sub-structures 111 may be identical to, or different from, the distance between the adjacent second organic light-emitting layer barrier sub-structures 121. When the first organic light-emitting layer barrier sub-structure 111 partially overlaps the second organic light-emitting layer barrier sub-structure 121 in the first direction, there is a gap between each first organic light-emitting layer barrier sub-structure 111 and the adjacent second organic light-emitting layer barrier sub-structure 121, to block the flow of the ink.

The distance between the adjacent first organic light-emitting layer barrier sub-structures 111 and the distance between the adjacent second organic light-emitting layer barrier sub-structures 121 may be set according to the practical need but not limited to those mentioned hereinabove. The first organic light-emitting layer barrier sub-structure 111 and the second organic light-emitting layer barrier sub-structure 121 are provided to reduce the movement speed of the ink at the periphery of the subpixel to the center, so the smaller the distance between the adjacent first organic light-emitting layer barrier sub-structures 111 and the distance between the adjacent second organic light-emitting layer barrier sub-structures 121, the smaller the movement speed of the ink at the periphery of the subpixel to the center, and the better the uniformity of the thin film.

Illustratively, a height of the first organic light-emitting layer barrier sub-structure 111 in a direction perpendicular to the base substrate (i.e., direction Z in FIG. 3) is substantially identical to a height of the first pixel sub-bank 11 in the direction perpendicular to the base substrate, and a height of the second organic light-emitting layer barrier sub-structure 121 in the direction perpendicular to the base substrate is substantially identical to a height of the second pixel sub-bank 12 in the direction perpendicular to the base substrate.

It should be appreciated that, the expression "substantially identical to" refers to that the height of the first organic light-emitting layer barrier sub-structure 111 in the direction perpendicular to the base substrate is essentially identical to the height of the first pixel sub-bank 11 in the direction perpendicular to the base substrate (i.e., a difference between the heights is within an allowable error range, e.g., 0.05 μm to 0.1 μm), and the height of the second organic light-emitting layer barrier sub-structure 121 in the direction perpendicular to the base substrate is essentially identical to the height of the second pixel sub-bank 12 in the direction perpendicular to the base substrate (i.e., a difference between the heights is within an allowable error range, e.g., 0.05 μm to 0.1 μm).

Theoretically, the height of the first organic light-emitting layer barrier sub-structure 111 in the direction perpendicular to the base substrate is identical to the height of the first pixel sub-bank 11 in the direction perpendicular to the base substrate, and the height of the second organic light-emitting layer barrier sub-structure 121 in the direction perpendicular to the base substrate is identical to the height of the second pixel sub-bank 12 in the direction perpendicular to the base substrate. However, in actual manufacture, there may exist a certain error, and this error is within an allowable range.

Illustratively, the height of the first organic light-emitting layer barrier sub-structure 111 in the direction perpendicular to the base substrate is 1.2 μm to 2 μm, and the height of the second organic light-emitting layer barrier sub-structure 121 in the direction perpendicular to the base substrate is 1.2 μm to 2 μm.

Illustratively, the height of the first organic light-emitting layer barrier sub-structure 111 is identical to the height of the second organic light-emitting layer barrier sub-structure 121 in the direction perpendicular to the base substrate.

Illustratively, the first organic light-emitting layer barrier sub-structure 111 is formed integrally with the first pixel sub-bank 11, and the second organic light-emitting layer barrier sub-structure 121 is formed integrally with the second pixel sub-bank 12.

When the first organic light-emitting layer barrier sub-structure 111 is formed integrally with the first pixel sub-bank 11, the height of the first organic light-emitting layer barrier sub-structure 111 in the direction perpendicular to the base substrate is identical to the height of the first pixel sub-bank 11 in the direction perpendicular to the base substrate.

When the second organic light-emitting layer barrier sub-structure 121 is formed integrally with the second pixel sub-bank 12, the height of the second organic light-emitting layer barrier sub-structure 121 in the direction perpendicular to the base substrate is identical to the height of the second pixel sub-bank 12 in the direction perpendicular to the base substrate.

Figure 4:
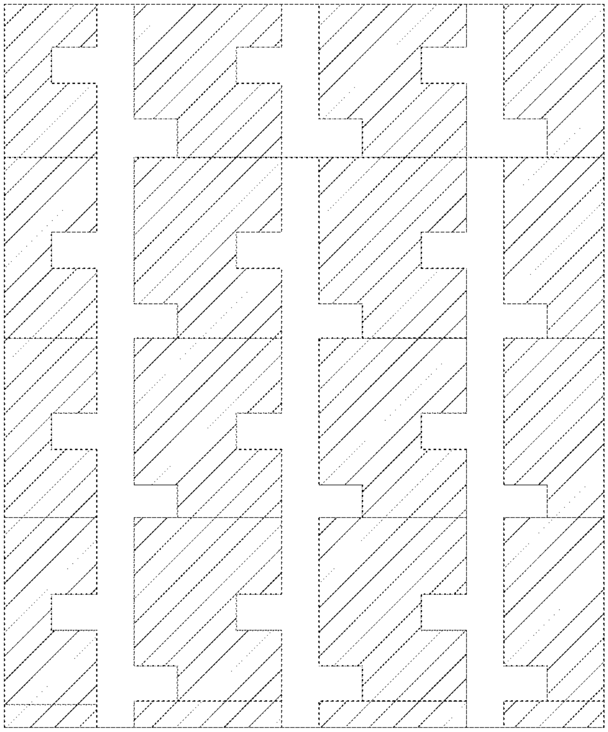
FIG. 4 is a schematic view showing a mask for forming the organic light-emitting layer barrier structure in FIG. 1.

In an embodiment of the present disclosure, the first organic light-emitting layer barrier sub-structure 111, the first pixel sub-bank 11, the second organic light-emitting layer barrier sub-structure 121 and the second pixel sub-bank 12 are formed through a mask using an evaporation process, and FIG. 4 shows a structure of the mask during the evaporation.

Figure 5:
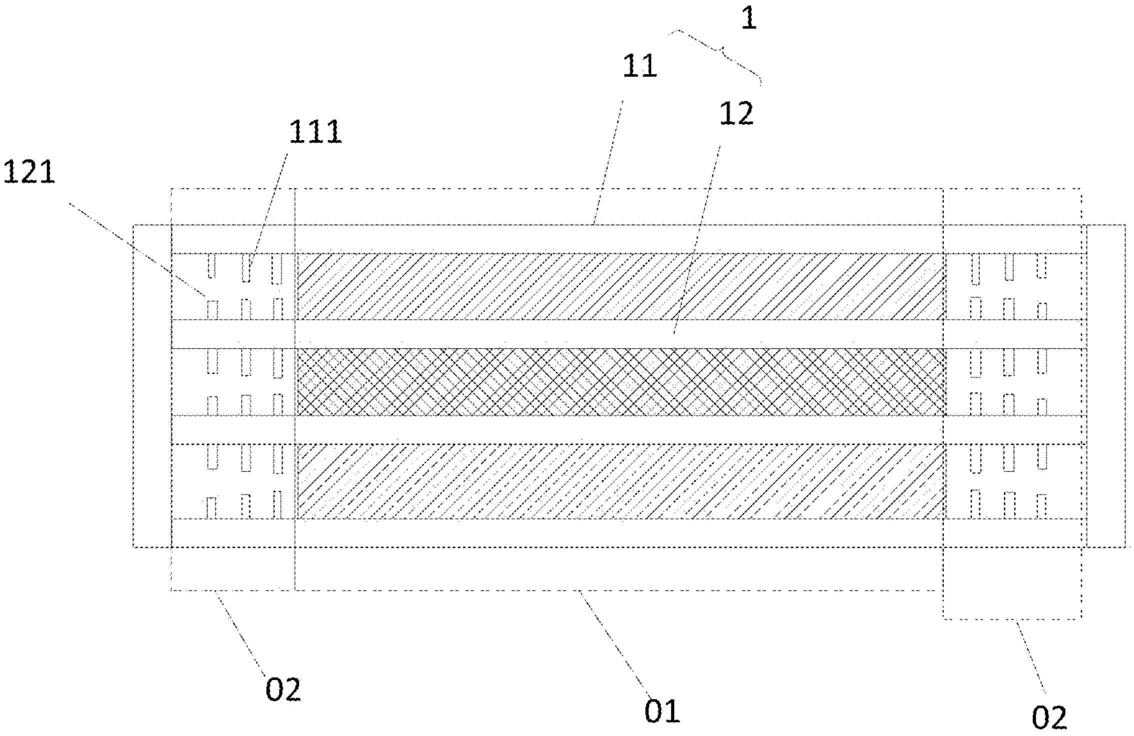
FIG. 5 is another schematic view showing the display substrate according to one embodiment of the present disclosure.
Figure 6:
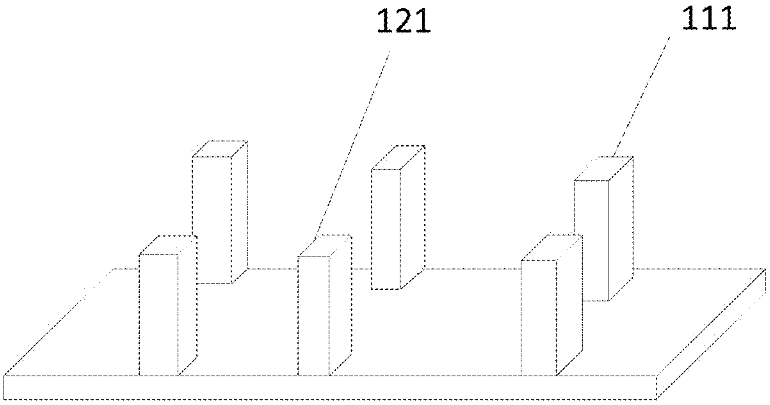
FIG. 6 is another schematic view showing the organic light-emitting layer barrier structure according to one embodiment of the present disclosure.
Figure 7:
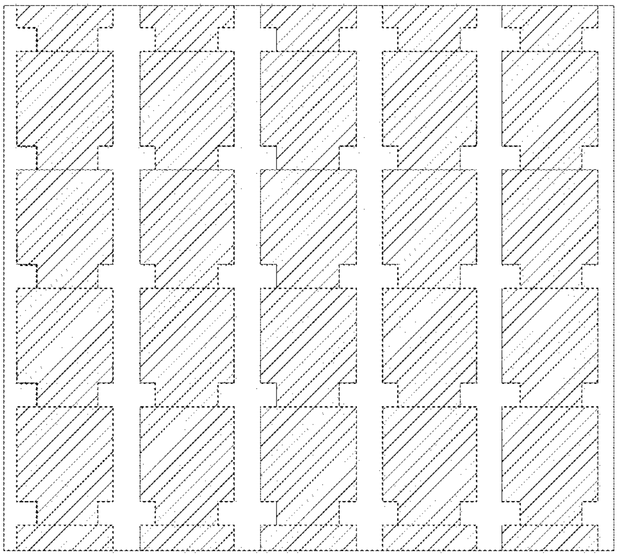
FIG. 7 is a schematic view showing a mask for forming the organic light-emitting layer barrier structure in FIG. 5.

In a second structural form, as shown in FIGS. 5 to 7, illustratively, an orthogonal projection of the first organic light-emitting layer barrier sub-structure 111 onto the second pixel sub-bank 12 covers the second organic light-emitting layer barrier sub-structure 121, and a gap between the first organic light-emitting layer barrier sub-structure 111 and the second organic light-emitting layer barrier sub-structure 121 is greater than 0.

Illustratively, a distance between the first organic light-emitting layer barrier sub-structure 111 and the second organic light-emitting layer barrier sub-structure 121 gradually decreases in a direction facing the light-emitting region 01.

In the embodiments of the present disclosure, the first organic light-emitting layer barrier sub-structures 111 correspond to the second organic light-emitting layer barrier sub-structures 121 respectively, and each first organic light-emitting layer barrier sub-structure 111 is arranged opposite to a corresponding second organic light-emitting layer barrier sub-structure 121. In the direction facing the light-emitting region 01, the distance between each first organic light-emitting layer barrier sub-structure 111 and the corresponding second organic light-emitting layer barrier sub-structure 121 gradually decreases, to reduce the movement speed of the ink to the light-emitting region 01.

Illustratively, in the first direction, the closer to the light-emitting region 01, the larger the height of the first organic light-emitting layer barrier sub-structure 111 in the direction perpendicular to the base substrate. In addition, in the first direction, the closer to the light-emitting region 01, the larger the height of the second organic light-emitting layer barrier sub-structure 121 in the direction perpendicular to the base substrate.

Illustratively, a distance between the adjacent first organic light-emitting layer barrier sub-structures 111 is 10% to 70% of a length of the light-emitting region 01 in the first direction, and a distance between the adjacent second organic light-emitting layer barrier sub-structures 121 is 10% to 70% of the length of the light-emitting region 01 in the first direction.

In a specific embodiment of the present disclosure, the distance between the adjacent first organic light-emitting layer barrier sub-structures 111 is 30% to 50% of the length of the light-emitting region 01 in the first direction, and the distance between the adjacent second organic light-emitting layer barrier sub-structures 121 is 30% to 50% of the length of the light-emitting region 01 in the first direction.

The distance between the adjacent first organic light-emitting layer barrier sub-structures 111 and the distance between the adjacent second organic light-emitting layer barrier sub-structures 121 may be set according to the practical need but not limited to those mentioned hereinabove. The first organic light-emitting layer barrier sub-structure 111 and the second organic light-emitting layer barrier sub-structure 121 are provided to reduce the movement speed of the ink at the periphery of the subpixel to the center, so the smaller the distance between the adjacent first organic light-emitting layer barrier sub-structures 111 and the distance between the adjacent second organic light-emitting layer barrier sub-structures 121, the smaller the movement speed of the ink at the periphery of the subpixel to the center, and the better the uniformity of the thin film.

Illustratively, a height of the first organic light-emitting layer barrier sub-structure 111 in a direction perpendicular to the base substrate is substantially identical to a height of the first pixel sub-bank 11 in the direction perpendicular to the base substrate, and a height of the second organic light-emitting layer barrier sub-structure 121 in the direction perpendicular to the base substrate is substantially identical to a height of the second pixel sub-bank 12 in the direction perpendicular to the base substrate.

It should be appreciated that, the expression "substantially identical to" refers to that the height of the first organic light-emitting layer barrier sub-structure 111 in the direction perpendicular to the base substrate is essentially identical to the height of the first pixel sub-bank 11 in the direction perpendicular to the base substrate (i.e., a difference between the heights is within an allowable error range, e.g., 0.05 μm to 0.1 μm), and the height of the second organic light-emitting layer barrier sub-structure 121 in the direction perpendicular to the base substrate is essentially identical to the height of the second pixel sub-bank 12 in the direction perpendicular to the base substrate (i.e., a difference between the heights is within an allowable error range, e.g., 0.05 μm to 0.1 μm).

Theoretically, the height of the first organic light-emitting layer barrier sub-structure 111 in the direction perpendicular to the base substrate is identical to the height of the first pixel sub-bank 11 in the direction perpendicular to the base substrate, and the height of the second organic light-emitting layer barrier sub-structure 121 in the direction perpendicular to the base substrate is identical to the height of the second pixel sub-bank 12 in the direction perpendicular to the base substrate. However, in actual manufacture, there may exist a certain error, and this error is within an allowable range.

Illustratively, the height of the first organic light-emitting layer barrier sub-structure 111 in the direction perpendicular to the base substrate is 1.2 μm to 2 μm, and the height of the second organic light-emitting layer barrier sub-structure 121 in the direction perpendicular to the base substrate is 1.2 μm to 2 μm.

Illustratively, the first organic light-emitting layer barrier sub-structure 111 is formed integrally with the first pixel sub-bank 11, and the second organic light-emitting layer barrier sub-structure 121 is formed integrally with the second pixel sub-bank 12.

When the first organic light-emitting layer barrier sub-structure 111 is formed integrally with the first pixel sub-bank 11, the height of the first organic light-emitting layer barrier sub-structure 111 in the direction perpendicular to the base substrate is identical to the height of the first pixel sub-bank 11 in the direction perpendicular to the base substrate.

When the second organic light-emitting layer barrier sub-structure 121 is formed integrally with the second pixel sub-bank 12, the height of the second organic light-emitting layer barrier sub-structure 121 in the direction perpendicular to the base substrate is identical to the height of the second pixel sub-bank 12 in the direction perpendicular to the base substrate.

Illustratively, the first organic light-emitting layer barrier sub-structure 111, the first pixel sub-bank 11, the second organic light-emitting layer barrier sub-structure 121 and the second pixel sub-bank 12 are formed through a mask using an evaporation process, and FIG. 7 shows a structure of the mask during the evaporation.

Figure 8:
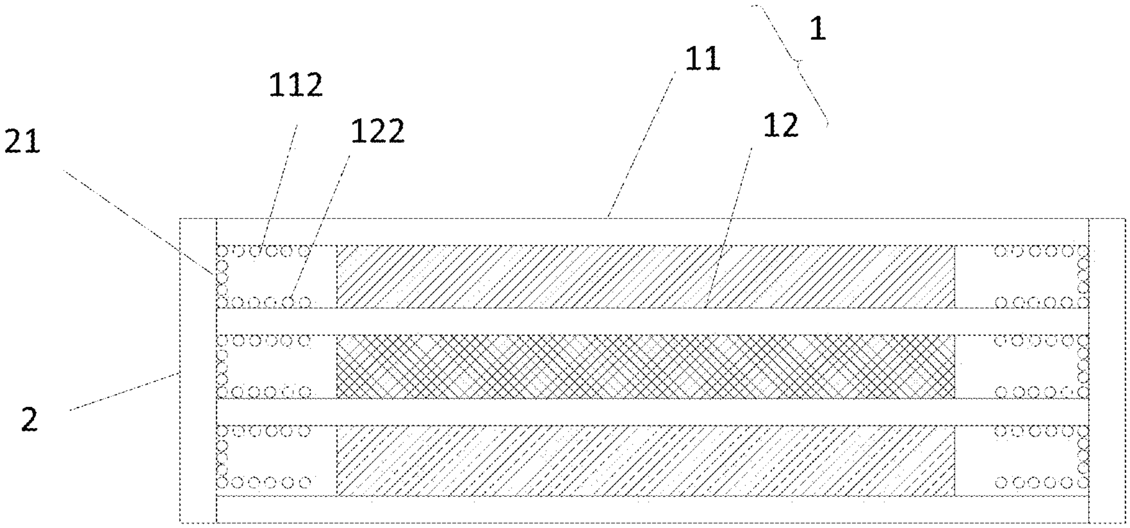
FIG. 8 is yet another schematic view showing the display substrate according to one embodiment of the present disclosure.
Figure 9:
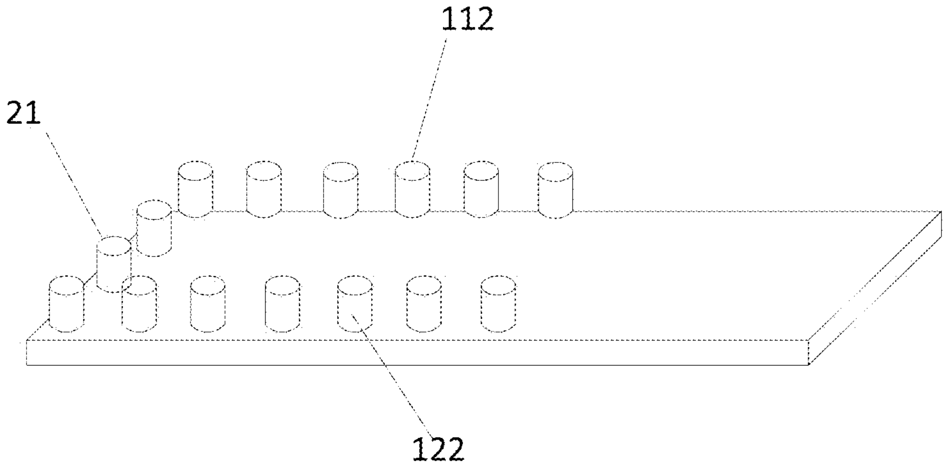
FIG. 9 is yet another schematic view showing the organic light-emitting layer barrier structure according to one embodiment of the present disclosure.
Figure 10:
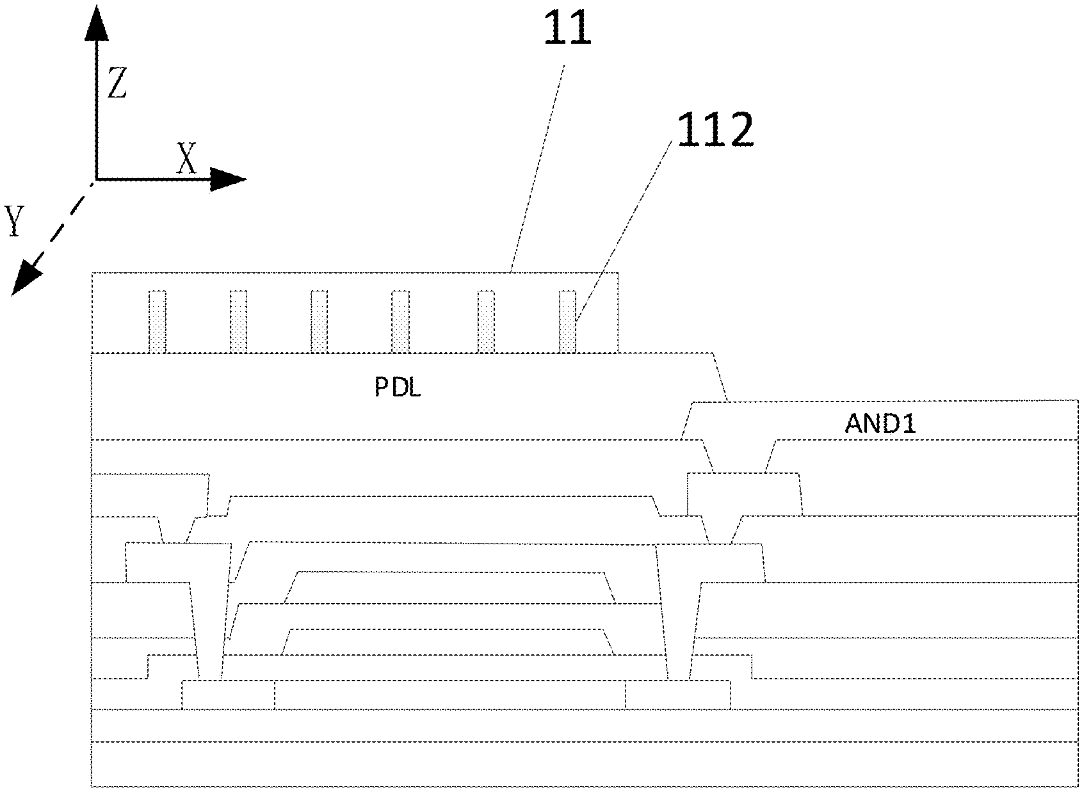
FIG. 10 is a partial sectional view of the display substrate in FIG. 8.

In a third structural form, as shown in FIGS. 8 to 10, illustratively, the pixel banks further include second pixel banks 2 extending in a second direction perpendicular to the first direction, and two first pixel banks 1 opposite to each other and two second pixel banks 2 opposite to each other are configured to define one subpixel. Two adjacent first pixel banks 1 include a first pixel sub-bank 11 and a second pixel sub-bank 12, and in the non-light-emitting region 02, the organic light-emitting layer barrier structure includes at least one first drainage post 112 arranged at a side of the first pixel sub-bank 11 close to the second pixel sub-bank 12, and/or at least one second drainage post 122 arranged at a side of the second pixel sub-bank 12 close to the first pixel sub-bank 11.

Illustratively, the organic light-emitting layer barrier structure includes at least one first drainage post 112 arranged at a side of the first pixel sub-bank 11 close to the second pixel sub-bank 12, at least one second drainage post 122 arranged at a side of the second pixel sub-bank 12 close to the first pixel sub-bank 11, and at least one third drainage post 21 arranged at a side of the second pixel bank 2 close to the non-light-emitting region.

Illustratively, a plurality of first drainage posts 112 is spaced apart from each other in the first direction at a side of the first pixel sub-bank 11 close to the second pixel sub-bank 12, a plurality of second drainage posts 122 is spaced apart from each other in the first direction at a side of the second pixel sub-bank 12 close to the first pixel sub-bank 11, and a plurality of third drainage posts 21 is spaced apart from each other in the second direction at a side of the second pixel bank 2 close to the non-light-emitting region.

Illustratively, the first drainage post 112, the second drainage post 122 and the third drainage post 21 are lyophilic, heights of the first drainage post 112, the second drainage post 122 and the third drainage post 21 in a direction perpendicular to the base substrate are the same, and the height of the first drainage post 112 in the direction perpendicular to the base substrate is 70% to 90% of a height of the first pixel sub-bank 11.

Illustratively, the height of the first drainage post is 3 μm to 8 μm.

In the embodiments of the present disclosure, the first drainage post 112, the second drainage post 122 and the third drainage post 21 are configured to prevent the movement of the ink to the center in a drying process. In order to ensure a drainage effect, the first drainage post 112, the second drainage post 122 and the third drainage post 21 are lyophilic. In order to prevent lyophobicity of the pixel bank from being adversely affected by the first drainage post 112, the second drainage post 122 and the third drainage post 21, prevent the integrity of a liquid surface from being adversely affected and prevent the occurrence of crosstalk, the heights of the first drainage post 112, the second drainage post 122 and the third drainage post 21 in a direction perpendicular to the base substrate need to be smaller than the height of the pixel bank in the direction perpendicular to the base substrate. In an embodiment of the present disclosure, the height of each of the first drainage post 112, the second drainage post 122 and the third drainage post 21 is 3 μm to 8 μm.

Illustratively, a gap between two adjacent first drainage posts 112 is 10 μm to 15 μm, a gap between two adjacent second drainage posts 122 is 10 μm to 15 μm, and a gap between two adjacent third drainage posts 21 is 10 μm to 15 μm.

The gaps between two adjacent first drainage posts 112, the gap between two adjacent second drainage posts 122 and the gap between two adjacent third drainage posts 21 may be set according to the practical need. The larger the density of the first drainage posts 112, the second drainage posts 122 and the third drainage posts 21, the better the drainage effect. Through the gaps with the above-mentioned values, it is able to improve the uniformity of the thin film.

Illustratively, the first drainage post 112, the second drainage post 122 and the third drainage post 21 are made of $SiO_2$ or $SiN_x$, or an organic lyophobic material.

Figure 11:
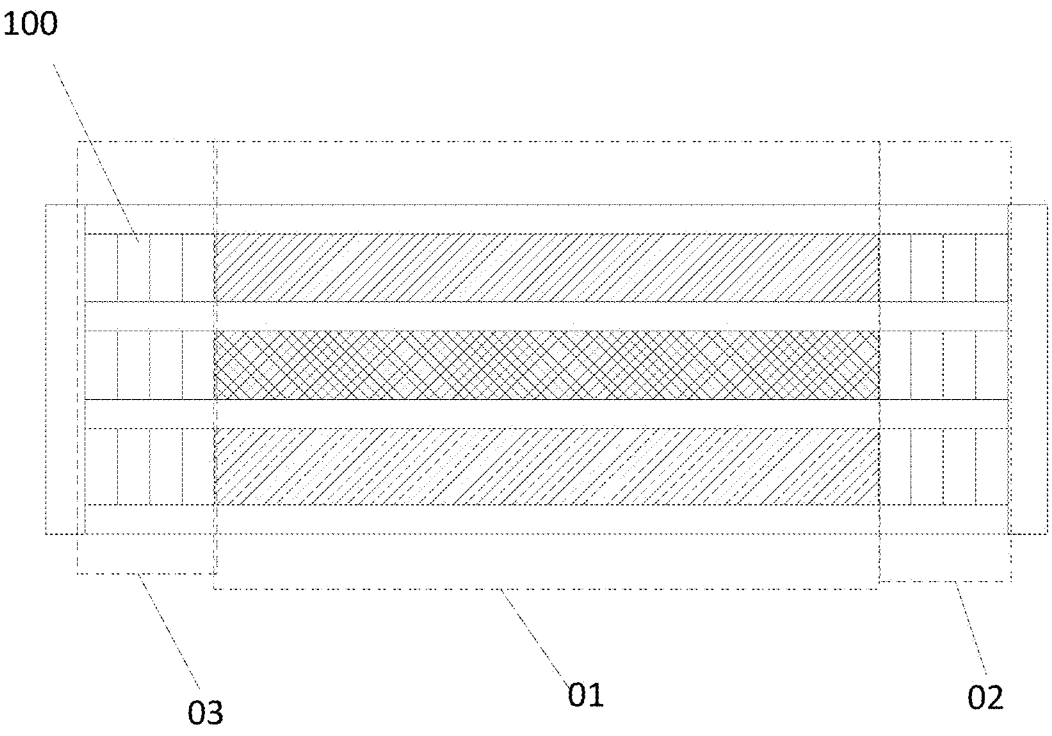
FIG. 11 is still yet another schematic view showing the display substrate according to one embodiment of the present disclosure.
Figure 12:
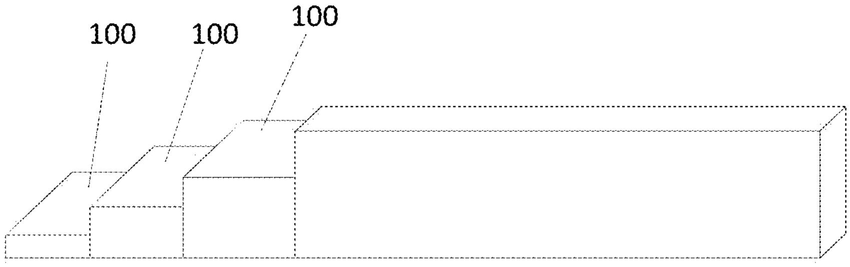
FIG. 12 is still yet another schematic view showing the organic light-emitting layer barrier structure according to one embodiment of the present disclosure.
Figure 13:
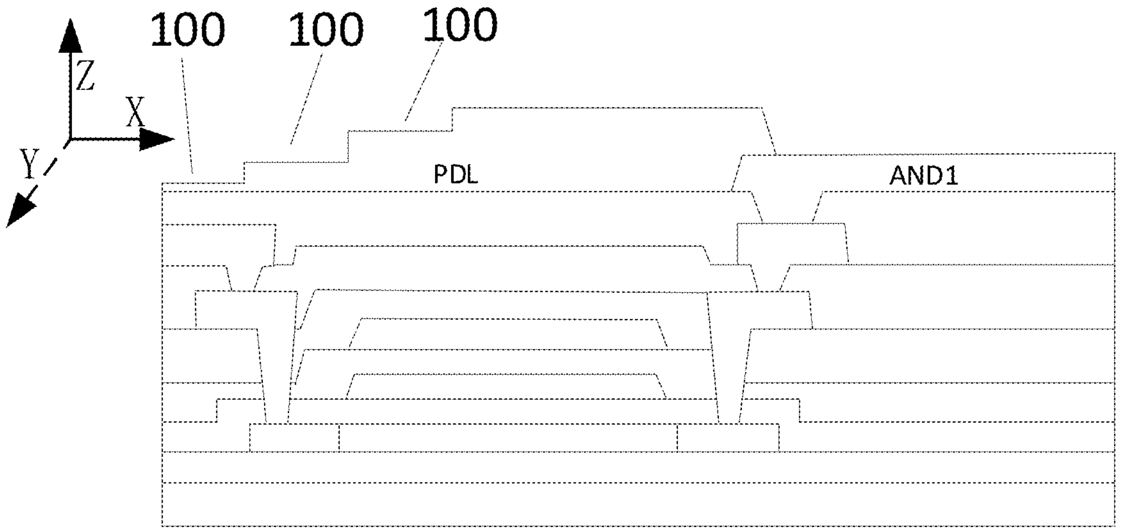
FIG. 13 is a partial sectional view of the display substrate in FIG. 11.

In a fourth structural form, as shown in FIGS. 11 to 13, the organic light-emitting layer barrier structure includes a plurality of step-like grooves 100 formed in the non-light-emitting region 02, and depths of the step-like grooves 100 in the direction perpendicular to the base substrate gradually decrease in a direction facing the light-emitting region 01.

The quantity of the step-like grooves and the depth of each groove may be set according to the practical need. Illustratively, three step-kike grooves are provided, with a maximum depth of 1 μm and a minimum depth of 0.1 μm, as shown in FIG. 12.

Illustratively, a total length of the plurality of step-like grooves 100 in the first direction is 1 to 1.5 times of a length of the light-emitting region. In the embodiments of the present disclosure, the pixel bank is made of polyimide (PI).

Illustratively, the pixel definition layer PDL is made of acrylics or organic resin.

The present disclosure further provides in some embodiments a display panel including the above-mentioned display substrate.

The present disclosure further provides in some embodiments a display device including the above-mentioned display panel.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, an anode layer arranged on the base substrate, an organic light-emitting layer arranged on the anode layer, a pixel definition layer arranged at a side of the anode layer away from the base substrate and configured to define a plurality of pixels, and a plurality of pixel banks arranged on the pixel definition layer; wherein the pixel banks comprise first pixel banks each arranged between two adjacent subpixels, each first pixel bank is a line bank extending in a first direction, the first pixel banks comprise a first pixel sub-bank and a second pixel sub-bank, a light-emitting region covering an anode of an Organic Light-Emitting Diode (OLED) element and non-light-emitting regions outside the light-emitting region are arranged between the first pixel sub-bank and the second pixel sub-bank in a same pixel along the first direction, the anode of the OLED element is located at the anode layer, the light-emitting region is located at a central position and arranged between two of the non-light-emitting regions in one subpixel in the first direction, and an organic light-emitting layer barrier structure is arranged at the non-light-emitting region;

wherein the first pixel sub-bank and the second pixel sub-bank divide each pixel into a plurality of subpixels;

wherein the organic light-emitting layer barrier structure comprises at least one first organic light-emitting layer barrier sub-structure arranged at a side of the first pixel sub-bank facing the second pixel sub-bank, and/or at least one second organic light-emitting layer barrier sub-structure arranged at a side of the second pixel sub-bank facing the first pixel sub-bank;

wherein an orthogonal projection of each first organic light-emitting layer barrier sub-structure onto the second pixel sub-bank is located between two adjacent second organic light-emitting layer barrier sub-structures;

wherein the display substrate further comprises a gap, the gap is between the first organic light-emitting layer barrier sub-structure and the second organic light-emitting layer barrier sub-structure and is greater than to Oum in a direction perpendicular to the first direction, and the first organic light-emitting layer barrier sub-structure does not overlap the second organic light-emitting layer barrier structure in the first direction.

2. The display substrate according to claim 1, wherein the organic light-emitting layer barrier structure is arranged at a side of the pixel definition layer away from the base substrate, and the organic light-emitting layer barrier structure is arranged at a same laminate layer as the pixel banks.

3. The display substrate according to claim 1, wherein each subpixel is provided with a plurality of the first organic light-emitting layer barrier sub-structures spaced apart from each other in the first direction and/or a plurality of the second organic light-emitting layer barrier sub-structures spaced apart from each other in the first direction.

4. The display substrate according to claim 1, wherein the plurality of the first organic light-emitting layer barrier sub-structures spaced apart from each other in the first direction comprise adjacent first organic light-emitting layer barrier sub-structures, a distance between the adjacent first organic light-emitting layer barrier sub-structures is 10% to 70% of a length of the light-emitting region in the first direction, the plurality of the second organic light-emitting layer barrier sub-structures spaced apart from each other in the first direction comprise adjacent second organic light-emitting layer barrier sub-structures, and a distance between the adjacent second organic light-emitting layer barrier sub-structures is 10% to 70% of the length of the light-emitting region in the first direction;

wherein the first direction corresponds to a long direction of the light-emitting region.

5. The display substrate according to claim 1, wherein a height of the first organic light-emitting layer barrier sub-structure in a direction perpendicular to the base substrate is substantially identical to a height of the first pixel sub-bank in the direction perpendicular to the base substrate, and a height of the second organic light-emitting layer barrier sub-structure in the direction perpendicular to the base substrate is substantially identical to a height of the second pixel sub-bank in the direction perpendicular to the base substrate.

6. The display substrate according to claim 1, wherein a height of the first organic light-emitting layer barrier sub-structure in a direction perpendicular to the base substrate is 1.2 μm to 2 μm, and a height of the second organic light-emitting layer barrier sub- structure in the direction perpendicular to the base substrate is 1.2 μm to 2 μm.

7. A display device comprising the display substrate according to claim 1.

* * * * *